United States Patent
Imbornone et al.

[11] Patent Number: 6,137,376
[45] Date of Patent: Oct. 24, 2000

[54] PRINTED BALUN CIRCUITS

[75] Inventors: James Imbornone, Methuen; Jean-Marc Mourant, Groton, both of Mass.

[73] Assignee: International Business Machines Corporation, Armonk, N.Y.

[21] Appl. No.: 09/354,376

[22] Filed: Jul. 14, 1999

[51] Int. Cl.$^7$ .................................................. H03H 7/42
[52] U.S. Cl. .............................................. 333/25; 333/26
[58] Field of Search ...................... 333/25, 26; 343/889

[56] References Cited

U.S. PATENT DOCUMENTS

| | | | |
|---|---|---|---|
| 4,857,869 | 8/1989 | Terakawa et al. | 333/26 |
| 5,587,692 | 12/1996 | Graham et al. | 333/25 X |
| 6,052,039 | 4/2000 | Chiou et al. | 333/25 X |

*Primary Examiner*—Paul Gensler
*Attorney, Agent, or Firm*—Lawrence D. Cutter

[57] ABSTRACT

A planar BALUN circuit comprises two separate parallel branches with three capacitive elements. The values of the capacitive elements are selected to provide impedances which first of all enhance balanced current flow and which also impede and reduce unbalanced current flow. The circuit is provided so as to lie substantially in a single plane as a pattern disposed on a printed circuit board together with either certain discrete capacitive elements or with capacitive structures which are also printed on the board. The BALUN circuits of the present invention are particularly useful for circuits operating in the gigahertz range and are particularly useful in light weight devices such as cellular telephones and cellular telephone systems.

6 Claims, 3 Drawing Sheets

PRINTED BALUN CIRCUITS

BACKGROUND OF THE INVENTION

The present invention is generally directed to BALUN transformer circuits for analog signals. More particularly, the present invention is directed to the construction of BALUN circuits which are formed on printed circuit boards or other insulative substrates. Even more particularly the present invention is directed to BALUN transformer structures in which high and low impedances are realized without the use of twisted wire pairs or the use of a ferrite core.

A BALUN is an electronic circuit component which is employed to provide impedance balance in radio frequency (RF) circuits. In essence the BALUN is a balanced to unbalance transformer. These devices are used in radio frequency applications to connect unbalanced components and circuits to balanced ones.

Unbalanced circuit components are usually large and expensive and include such devices as filters and power amplifiers. To make them balanced, while possible, would require them to be twice as large and twice as expensive. On the other hand, balanced components are usually found in integrated circuits because the cost of doubling the number of internal components is low in an integrated circuit structure. Balanced circuits also have desirable electrical properties. They have improved signal isolation and linearity characteristics and accordingly are used whenever possible. In an unbalanced circuit the current is typically carried by a single wire and returns through a ground which is preferably a large conductor which either forms the chassis for the device or is otherwise directly and electrically connected directly to the chassis. On the other hand, a balanced circuit typically includes two conductors and a ground. In the BALUN case, current flows "down" one conductor and returns via the other one. This eliminates current flowing through the ground. This is the ideal situation.

BALUN circuits are desired in radio design because chip designs tend to be differential while external components tend to be single ended. Hence a BALUN transformer is needed to couple internal and external components. However, BALUNS generally have limitations with respect to cost and size particularly when it comes to their use in radio frequency devices such as cellular telephones. These devices clearly require BALUNS that exhibit small sizes particularly with respect to the other components in a cellular telephone or cellular telephone system. Hence there is a need for small inexpensive BALUN transformers that also exhibit good electrical performance. Additionally, while it is possible to implement BALUNS as an integrated circuit, such circuits have poor electrical performance and typically exhibit high loss.

SUMMARY OF THE INVENTION

In accordance with a preferred embodiment of the present invention a radio frequency BALUN transformer comprises a first, non-closed conductor loop which has an input end which is connected to a ground plane, and which also has an output end. The BALUN also includes a second, non-closed conductor loop which is disposed substantially parallel to the first conductor loop. This second conductor loop also has a first end for signal input and a second end adjacent to the output of the first conductor loop for signal output. A first capacitive means is connected between the first end of the second conductor loop and the second end of the second conductor loop. The first and second ends of the first conductor loop are disposed in substantially adjacent positions. A second capacitive means is electrically connected across the first and second conductor loops at a point which is intermediate to the first and second ends and the input and output ends respectively. Lastly a third capacitive means connects the output end of the first conductor to the ground plane.

This circuit has the desirable characteristic that it may be formed on a printed circuit board. As such it is very easily manufactured at low cost and provides a circuit which consumes a relatively small portion of the printed circuit board. It should be noted however that while the invention described herein is particularly illustrated by a device mounted on a printed circuit board, any insulative substrate capable of having conductors affixed to it is a suitable member for containing and supporting the circuit. The BALUN circuit disclosed and claimed herein exhibits particular advantages not found in conventional BALUNS. In particular, conventional BALUNS use a pair of twisted wires wrapped on a ferrite core. The present invention avoids the use of twisted wires and also avoids the use of ferrite core. Such cores can be large and relatively heavy and furthermore add cost to the circuit. The present circuit avoids the use of ferrite cores and twisted wire pairs through the use of self-inductance and appropriately spaced and sized capacitive elements to control the manner in which high and low impedances are realized. The capacitive means employed in the present invention is sized to match the self-inductance of the wire loops employed so as to provide appropriate impedances at a predeterminable resident frequency range.

Accordingly, it is an object of the present invention to provide a BALUN circuit which is small, effective, easy to manufacture and which can be made for a low cost.

It is a further object of the present invention to provide a BALUN circuit which can be manufactured on a printed circuit board or other suitable substrate, particularly one which includes a ground plane or other associated ground conductor such as a chassis.

It is also an object of the present invention to provide a BALUN circuit which is employable in devices such as cellular telephones and/or base stations which service cellular telephone systems.

It is yet another object of the present invention to provide BALUN circuits which avoid the use of ferrites and which further avoid the use of twisted wire pairs as a mechanism for providing low impedance between balanced conductors in a, balanced differential signal circuit.

It is a still further object of the present invention to provide BALUN circuits which reduce the flow of current in ground circuits.

It is also and object of the present invention to provide a BALUN circuit which may be fabricated as a planar structure.

It is also an object of the present invention to provide a BALUN circuit with capacitive elements which are selected in accordance with self inductance values so as to provide appropriate of impedance levels.

It is yet another object of the present invention to provide a BALUN circuit in which desired capacitive elements are provided by means of interdigitated conductors.

Lastly, but not limited hereto, it is an object of the present invention to provide BALUN circuits that exhibit tunable aspects for improved performance efficiency and impedance matching characteristics.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
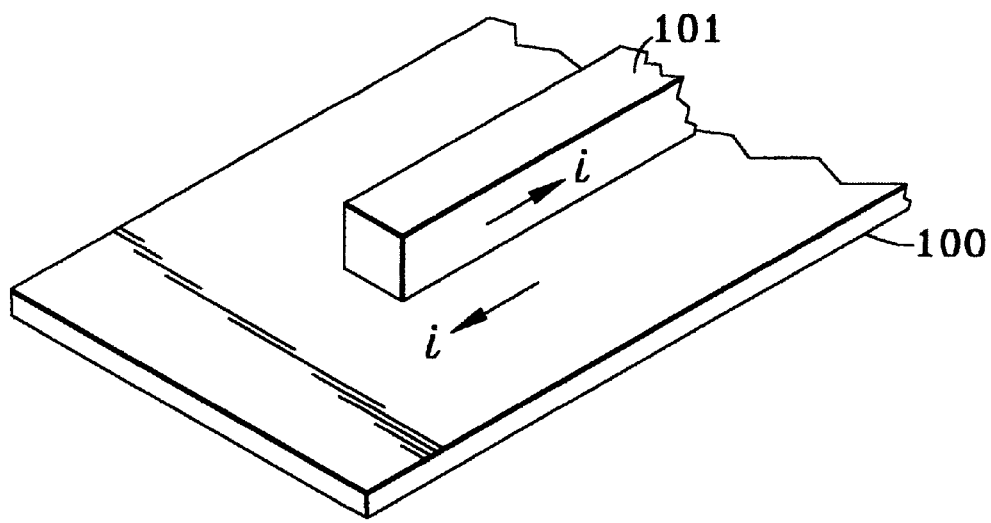
FIG. 1 is an isometric view illustrating an unbalanced or single-ended signal situation.
Figure 2:
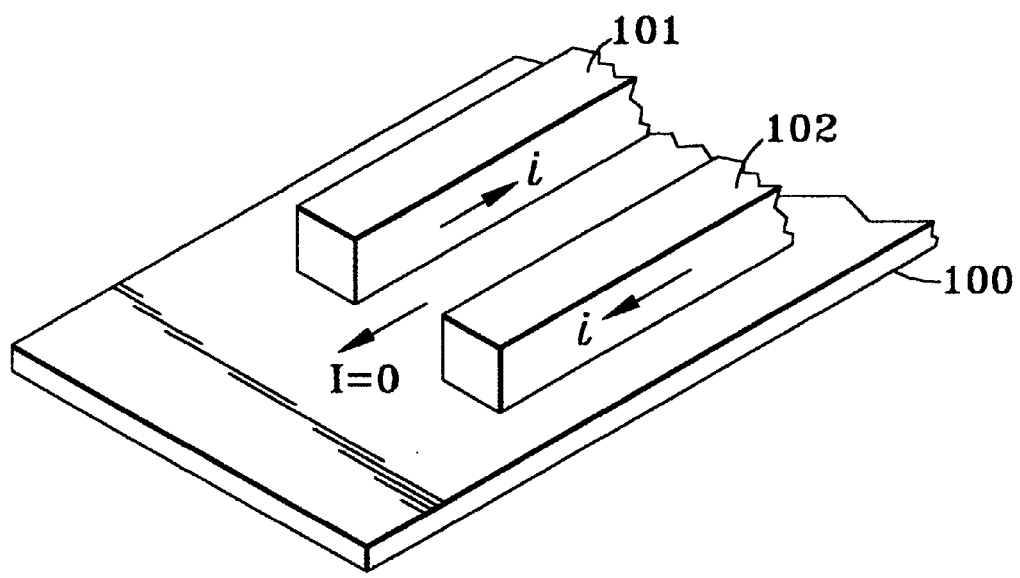
FIG. 2 is an isometric view similar to FIG. 1 except that it particularly illustrates a balanced or differential signal situation.

FIG. 1 illustrates the typical situation for unbalanced signal transmission. In this situation current i flowing through conductor 101 returns in an opposite direction through ground structure 100. The ground structure may comprise a chassis or buried conductive layer in a multilayer printed circuit board or ceramic structure. It is seen that in FIG. 1 a current propagates down wire 101 and returns through a large conductor, typically referred to as the ground 100. This situation is contrasted with the configuration shown in FIG. 2 which illustrates the transmission of a balanced or differential signal. In the balanced case, current i flows in one direction along conductor 101 and returns along separate conductor 102, in the opposite direction. In the balanced case the current in the ground plane 100 is ideally zero.

A BALUN is essentially a balanced to an unbalanced transformer.

Figure 6:
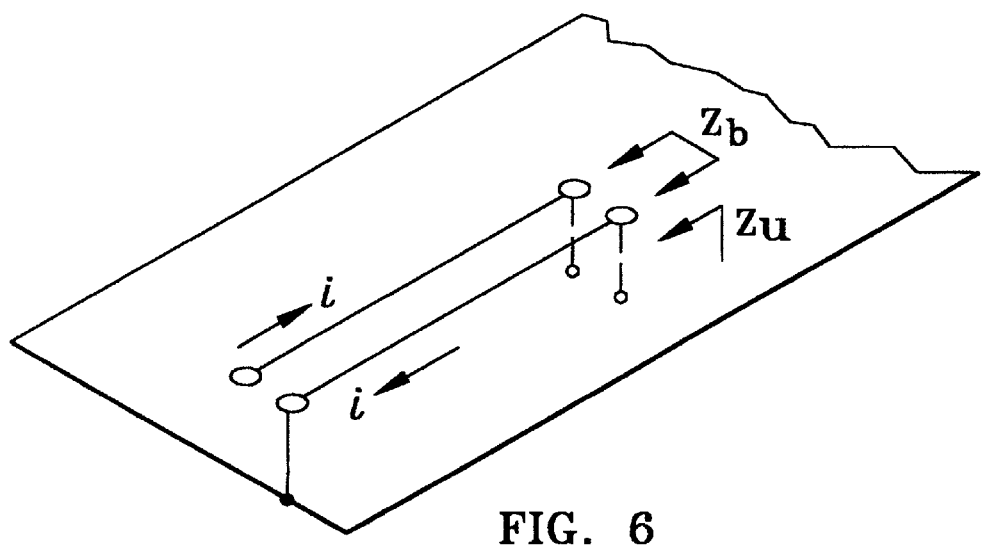
FIG. 6 is a partially isometric and partially schematic diagram illustrating the measurement of impedances in BALUN transformers.

As seen in FIG. 6 there is shown a balanced impedance between the two output wires of what could be configured to be a good BALUN circuit. This impedance is designated as $Z_b$. In a similar fashion there is an impedance $Z_u$ between a grounded BALUN conductor and the ground plane. It is an object of the present invention to create a low impedance path for the balanced mode. Correspondingly to disable the unbalanced mode, a high impedance path is created. More particularly, in the present invention the object is to provide a low impedance $Z_b$ while at the same time providing a high impedance $Z_u$.

Figure 3:
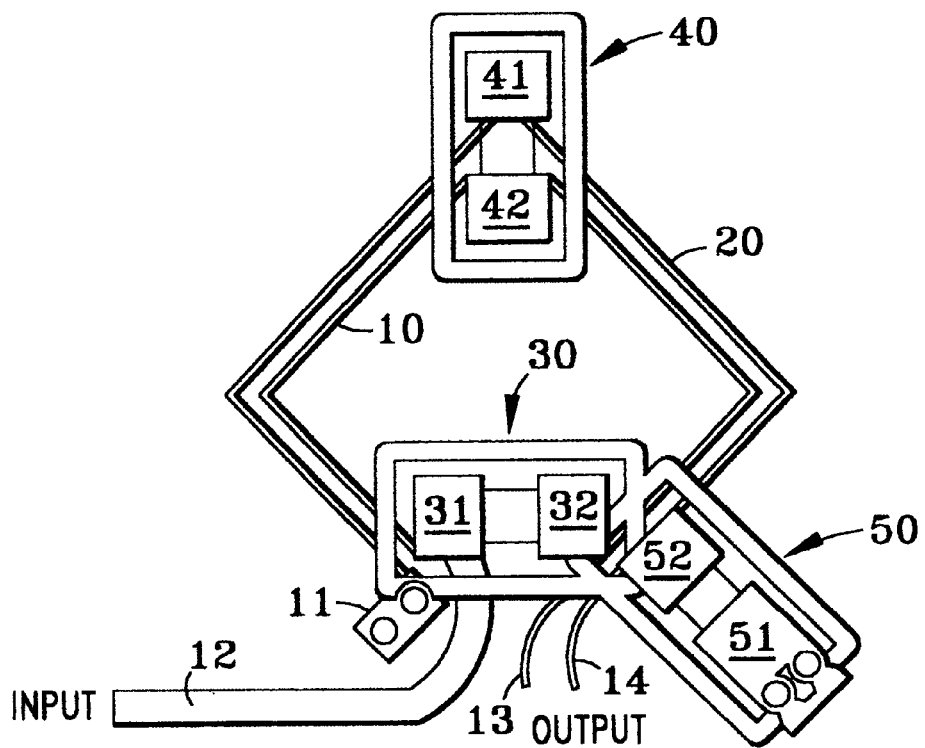
FIG. 3 is a top view of a balun made in accordance with the present invention.
Figure 4:
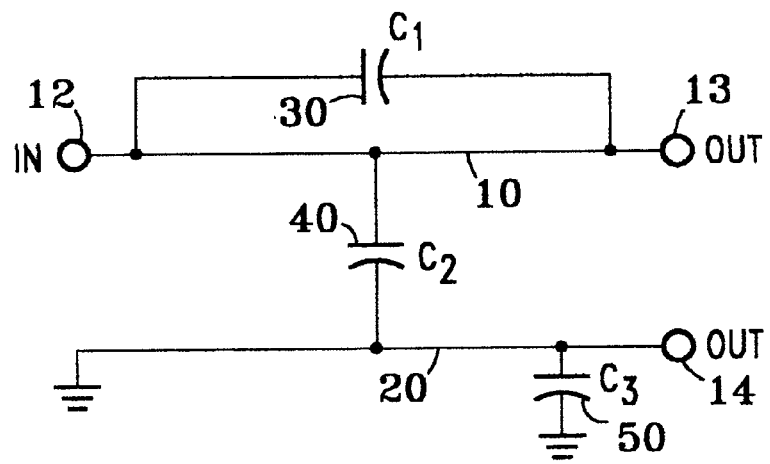
FIG. 4 is a top view of a BALUN similar to that shown in FIG. 3 except that in this instance at least 2 of the capacitive elements are provided by means of interdigitated conductors which are also printed on an insulative substrate.

FIG. 3 illustrates a BALUN structure produced in accordance with the present invention. In particular, there are shown two conductor loops, an inner loop 10 and an outer loop 20. Outer loop 20 includes at the input end pad 11 which is electrically connected to the circuit ground. At its input end conductive loop 10 includes input signal conductor 12. Conductor 12 is connected to conductive pad 31 which is also connected electrically to inner loop 10. Electrically conductive pads 31 and 32 are employed as the circuit contacts for capacitor $C_1$ (see reference numeral 3D in FIG. 4). Conductive pad 32 is electrically connected to the output end of inner loop 10. Outer conductive loop 20 is connected at its output end to conductive pad 52 which together with conductive pad 51 provides electrical connection means for attaching capacitor $C_3$ (see reference numeral 50 in FIG. 4). It is additionally noted that conductive pad 51 like conductive pad 11 is electrically attached to the ground. Additionally, conductive pads 41 and 42, connected to loops 20 and 10 respectively provide electrical attachment for capacitor $C_2$ (see reference numeral 40 in FIG. 4).

Figure 5:
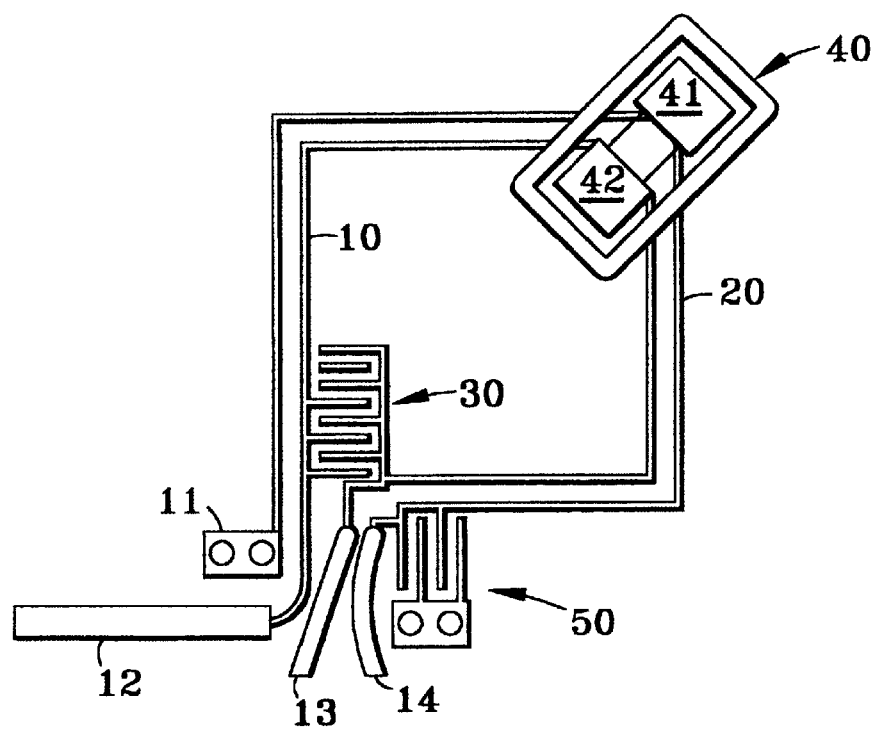
FIG. 5 is a schematic diagram illustrating an equivalent circuit for the BALUN devices shown in FIGS. 3 and 5.

Unlike many other BALUN circuits the present invention employs no ferrites. The high impedance necessary to reject the unbalance signal is provided by L-C parallel resonance. The circuit for providing these resonances is shown in FIGS. 3 and 5. In both of these Figures what is shown is a top view of a BALUN formed on a printed circuit board by means of conventional circuit printing methods. The pads for capacitor connection are shown where discrete capacitors are mounted. At the BALUN input an unbalanced signal connects to one of the two input wires The other wire is grounded. This way the unbalanced current returns either through the ground plane on the back of the printed circuit board or through a ground wire.

As a signal flows along the inside wire (conductive loop 10), the impedance to the ground plane increases due to the wire self inductance. At the same time the impedance to the neighboring conductive loop 20 remains low due to its close proximity. In particular, the self inductances are canceled due to the mutual inductance between the loops and the opposite flow of current. As the signal reaches the end of the inner loop and pad 32, the impedance to the ground plane is now infinite (at least theoretically) because the line self inductance L resonates with capacitor C in a parallel resonance circuit. In this circumstance substantially all of the current is thus returned through conductive loop 20.

To make this circuit operate efficiently as a BALUN transformer (also simply referred to only as a BALUN) is desirable to provide an infinite impedance between each output node 13 and 14 and the ground plane. At the same time, it is desirable to provide a low impedance between the output conductors themselves (that is between nodes 13 and 14). Parallel resonance between capacitors C, and the wire self inductance L, provides the high impedance for one output. The resonance of L and capacitor $C_3$ provides this high impedance for the second output conductor. The low input impedance between the wires is insured primarily by their proximity. Their self inductance is diminished by the mutual inductance between them since the wire currents flow in opposite directions. Whatever residual inductance there may be between conductive loop 10 and 20, it can be reduced by capacitor $C_2$ (See FIG. 4). Furthermore, it is possible to employ the residual inductance and capacitor $C_2$ to produce a low path impedance transformer between the input and output.

From a physical perspective, the circuit illustrated in FIG. 3 is particularly designed to operate at a frequency of approximately 950 mhz. For this frequency capacitors $C_1$ and $C_3$ preferably exhibit a capacitance of approximately one picofarad each; likewise with this frequency capacitor $C_2$ preferably exhibits a capacitance of approximately 3 picofarads. The BALUN is formed as a printed circuit on a board having a thickness of approximately 14 mils and also having a dielectric constant of 4.3. The circuits themselves are formed using half ounce copper having a thickness of approximately 0.7 mils. It is furthermore noted that the conductive loops shown in FIGS. 3 and 5 are preferably disposed in square or rectangular configurations. With respect to the circuit shown in FIG. 3 each side of the square leg of the conductive loop is approximately 0.22 inches long. It is noted however that the layout pattern for conductive loops 10 and 20 are not constrained to be either square or rectangular. Any convenient path may be employed. It is only desirable that the conductive paths be as close together as possible to minimize interloop impedance.

FIG. 5 illustrates an alternate embodiment of the present invention in which capacitors $C_1$ and $C_3$ are provided by interdigitated conductor structures 30, 50 as shown. The unconnected conductor shown is provided for tuning. The BALUN illustrated in FIG. 5 works in essentially the same manner as the BALUN shown in FIG. 3 except that it is designed for operation at a frequency of approximately 2.2 GHZ. For this, higher frequency of operation the capacitance needed is much smaller and printing capacitors as shown in FIG. 5 becomes a viable option. This further reduces BALUN cost even further. With respect to the physical characteristics of the circuit shown in FIG. 5, these are essentially the same as those that exist for the circuit in FIG. 3 with the exception that the length of the side of the square forming the conductive loop pattern is now approximately 0.25 inches instead of 0.22 inches It is also noted that the rectangular structures shown surrounding conductive contact pads 31, 32, 41, 42, 51 and 52 are provided for ease of mechanically attaching discrete capacitors $C_1$, $C_2$ and $C_3$ as needed. They do not form any part of the electrical structure.

From the above, it should be appreciated that all of the objectives of the present invention have been fulfilled by the circuits shown in applicants' Figures, particularly FIGS. 3 and 5. In particular, it should be appreciated that applicants have provided a low cost small easily frabicatable and inexpensive BALUN circuit. It is further seen that applicants have provided a BALUN circuit which does not require the utilization of twisted wire pairs. Accordingly, it is seen that applicants have advanced the state of the electrical arts with respect to the construction, structure, fabrication and performance of BALUN circuits.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A radio frequency balanced-unbalanced transformer for impedance matching in a circuit containing a ground plane, set transformer comprising:

a first, non-closed conductor loop having an input end electrically connected to said ground plane and also having an output end;

a second, non-closed conductor loop substantially parallel to said first conductor loop, said second conductor loop having a first end for signal input and a second end, adjacent to the output end of said first conductor loop for signal output;

first capacitive means connected between the first end of said second conductor loop and the second end of said conductor loop, said first and second ends of said first conductor loop being disposed in substantially adjacent positions;

second capacitive means electrically connected across said first and second conductor loops at a point intermediate said first and second ends and said input and output ends respectively;

third capacitive means connecting said output end of said first conductor to said ground plane.

2. The transformer of claim 1 in which the self inductance of said second loop together with the capacitance of said first capacitive means are selected to resonate at a particular signal frequency.

3. The transformer of claim 1 in which the self inductance of said second loop together with the capacitance of said third capacitive means are selected to resonate at a particular signal frequency.

4. The transformer of claim 1 in which said first and third capacitive means are implemented as interdigitated conductors disposed on an insulative substrate.

5. The transformer of claim 1 in which said first and second conductor loops lie substantially within a plane.

6. The transformer of claim 1 in which said first and second conductor loops are laid out in a square pattern.

* * * * *